United States Patent
Yoon et al.

(10) Patent No.: US 8,587,347 B2
(45) Date of Patent: Nov. 19, 2013

(54) GATE DRIVING CIRCUIT AND DISPLAY APPARATUS HAVING THE SAME

(75) Inventors: Soo-Wan Yoon, Hwaseong-si (KR); Yeong-Keun Kwon, Yongin-si (KR); Ji-Sun Kim, Seoul (KR); Young-Soo Yoon, Anyang-si (KR); Chong-Chul Chai, Seoul (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 0 days.

(21) Appl. No.: 13/546,132

(22) Filed: Jul. 11, 2012

(65) Prior Publication Data
US 2013/0181747 A1    Jul. 18, 2013

(30) Foreign Application Priority Data
Jan. 12, 2012    (KR) .............................. 2012-0003723

(51) Int. Cl.
*H03K 3/00* (2006.01)
(52) U.S. Cl.
USPC ............................ 327/108; 327/112; 345/100
(58) Field of Classification Search
USPC ................................... 327/108, 112; 345/100
See application file for complete search history.

(56) References Cited

U.S. PATENT DOCUMENTS

| | | | | |
|---|---|---|---|---|
| 7,932,887 | B2 * | 4/2011 | Kim et al. | ...................... 345/100 |
| 8,174,478 | B2 * | 5/2012 | Kim et al. | ...................... 345/100 |
| 2010/0039363 | A1 | 2/2010 | Lee et al. | |
| 2011/0058640 | A1 | 3/2011 | Shang et al. | |
| 2011/0122117 | A1 | 5/2011 | Lee et al. | |

FOREIGN PATENT DOCUMENTS

KR    1020110031051    3/2011

* cited by examiner

*Primary Examiner* — Kenneth B. Wells
(74) *Attorney, Agent, or Firm* — F. Chau & Associates, LLC

(57) ABSTRACT

A gate driving circuit includes a pull-up control part, a pull-up part, a carry part, a first pull-down part and a second pull-down part. The pull-up control part applies a carry signal from a previous stage to a first node. The pull-up part outputs an N-th gate output signal based on a clock signal. The carry part outputs an N-th carry signal based on the clock signal in response to the signal applied to the first node. The first pull-down part includes a plurality of transistors connected to each other in series. The first pull-down part pulls down a signal at the first node to a second off voltage in response to a carry signal of a next stage. The second pull-down part pulls down the N-th gate output signal to a first off voltage in response to the carry signal of the next stage.

27 Claims, 5 Drawing Sheets

GATE DRIVING CIRCUIT AND DISPLAY APPARATUS HAVING THE SAME

PRIORITY STATEMENT

This application claims priority under 35 U.S.C. §119 to Korean Patent Application No. 10-2012-0003723, filed on Jan. 12, 2012 in the Korean Intellectual Property Office KIPO, the disclosure of which is incorporated by reference in its entirety herein.

TECHNICAL FIELD

Exemplary embodiments of the present invention relate to a gate driving circuit and a display apparatus having the display panel.

DISCUSSION OF RELATED ART

A liquid crystal display ("LCD") apparatus may include a first substrate having a pixel electrode, a second substrate having a common electrode and a liquid crystal layer disposed between the first and second substrate. An electric field is generated by voltages applied to the pixel electrode and the common electrode. By adjusting an intensity of the electric field, a transmittance of a light passing through the liquid crystal layer may be adjusted so that a desired image may be displayed.

A display apparatus may include a display panel and a panel driver. The display panel includes a plurality of gate lines and a plurality of data lines. The panel driver includes a gate driver providing gate signals to the gate lines and a data driver providing data voltages to the data lines.

The gate driver includes a gate driving circuit including a plurality of switching elements. Each switching element may be a thin film transistor ("TFT"). When a relatively high voltage is applied between a drain electrode and a source electrode of a switching element in the gate driving circuit, a reliability of the gate driving circuit may deteriorate and a lifetime of the gate driving circuit may shorten.

In addition, since the gate driving circuit includes a number of the switching elements, it may consume a large amount of power and be expensive to manufacture.

SUMMARY

In an exemplary embodiment of a gate driving circuit according to the present invention, the N-th stage of the gate driving circuit includes a pull-up control part, a pull-up part, a carry part, a first pull-down part and a second pull-down part. The pull-up control part applies a previous carry signal to a first node from a stage previous to the N-th stage in response to the previous carry signal. The pull-up part outputs an N-th gate output signal based on a clock signal in response to a signal applied to the first node. The carry part outputs an N-th carry signal based on the clock signal in response to the signal applied to the first node. The first pull-down part includes a plurality of transistors connected to each other in series. The first pull-down part pulls down a signal at the first node to a second off voltage in response to a next carry signal from a stage after the N-th stage. The second pull-down part pulls down the N-th gate output signal to a first off voltage in response to the next carry signal. N is a natural number.

In an exemplary embodiment of a gate driving circuit according to the present invention, the N-th stage of the gate driving circuit includes a pull-up control part, a pull-up part, a carry part, a first pull-down part, a second pull-down part, an inverting part. The pull-up control part applies a previous carry signal to a first node from a stage previous to the N-th stage in response to the previous carry signal. The pull-up part outputs an N-th gate output signal based on a clock signal in response to a signal applied to the first node. The carry part outputs an N-th carry signal based on the clock signal in response to the signal applied to the first node. The first pull-down part pulls down a signal at the first node to a second off voltage in response to a next carry signal from a stage after the N-th stage. The second pull-down part pulls down the N-th gate output signal to a first off voltage in response to the next carry signal. The inverting part is configured to receive the clock signal and the second off voltage, and output an inverting signal. The inverting part of the N-th stage is connected to an inverting part of at least one stage that is after the N-th stage. N is a natural number.

In an exemplary embodiment of a display apparatus according to the present invention, the display apparatus includes a display panel, a data driving circuit and a gate driving circuit. The display panel has a display region on which an image is displayed and a peripheral region adjacent the display region. The data driving circuit applies a data voltage to the display panel. The gate driving circuit applies a gate output signal to the display panel. An N-th stage of the gate driving circuit includes a pull-up control part, a pull-up part, a carry part, a first pull-down part and a second pull-down part. The pull-up control part applies a previous carry signal to a first node from a stage previous to the N-th stage in response to the previous carry signal. The pull-up part outputs an N-th gate output signal based on a clock signal in response to a signal applied to the first node. The carry part outputs an N-th carry signal based on the clock signal in response to the signal applied to the first node. The first pull-down part includes a plurality of transistors connected to each other in series. The first pull-down part pulls down a signal at the first node to a second off voltage in response to a next carry signal from a stage after the N-th stage. The second pull-down part pulls down the N-th gate output signal to a first off voltage in response to the next carry signal. N is a natural number.

In an exemplary embodiment of a display apparatus according to the present invention, the display apparatus includes a display panel, a data driving circuit and a gate driving circuit. The display panel has a display region on which an image is displayed and a peripheral region adjacent the display region. The data driving circuit applies a data voltage to the display panel. The gate driving circuit applies a gate output signal to the display panel. An N-th stage of the gate driving circuit includes a pull-up control part, a pull-up part, a carry part, a first pull-down part, a second pull-down part, an inverting part. The pull-up control part applies a previous carry signal to a first node from a stage previous the N-th stage in response to the previous carry signal. The pull-up part outputs an N-th gate output signal based on a clock signal in response to a signal applied to the first node. The carry part outputs an N-th carry signal based on the clock signal in response to the signal applied to the first node. The first pull-down part pulls down a signal at the first node to a second off voltage in response to a next carry signal from a stage after the N-th stage. The second pull-down part pulls down the N-th gate output signal to a first off voltage in response to the next carry signal. The inverting part of the N-th stage is configured to receive the clock signal and the second off voltage, and output an inverting signal. The inverting part of the N-th stage is connected to an inverting part of at least one stage that is after the N-th stage. N is a natural number.

A gate driving circuit according to an exemplary embodiment of the invention includes first through sixth stages. Each of the second and fourth stages includes a pull-up control part, a charging part, a pull-up part, a carry part, an inverting part, a first pull-down part, a second pull-down part, a first holding part, a second holding part, a third holding part, and a reset part. A clock signal is applied to each inverting part and each carry part. A first carry signal output from the first stage is applied to the pull-up control part of the second stage. The second stage outputs a second carry signal. A third carry signal output from the third stage is applied to the first pull-down part of the second stage, the second pull-down part of the second stage, and the pull-up control part of the fourth stage, wherein a fourth carry signal output from the fourth stage is applied to the reset part of the second stage. A fifth carry signal output from the fifth stage is applied to the first pull-down part and the second pull-down part of the fourth stage. A sixth carry signal output from the sixth stage is applied to the reset part of the fourth stage.

BRIEF DESCRIPTION OF THE DRAWINGS

The present invention will become more apparent by describing in detail exemplary embodiments thereof with reference to the accompanying drawings, in which.

DETAILED DESCRIPTION

Hereinafter, the present invention will be explained in detail with reference to the accompanying drawings, in exemplary embodiments thereof are shown. The described embodiments may be modified in various different ways, without departing from the spirit or scope of the disclosure. As used herein, the singular forms, "a," "an" and "the" are intended to include the plural forms as well, unless the context clearly indicates otherwise.

Figure 1:
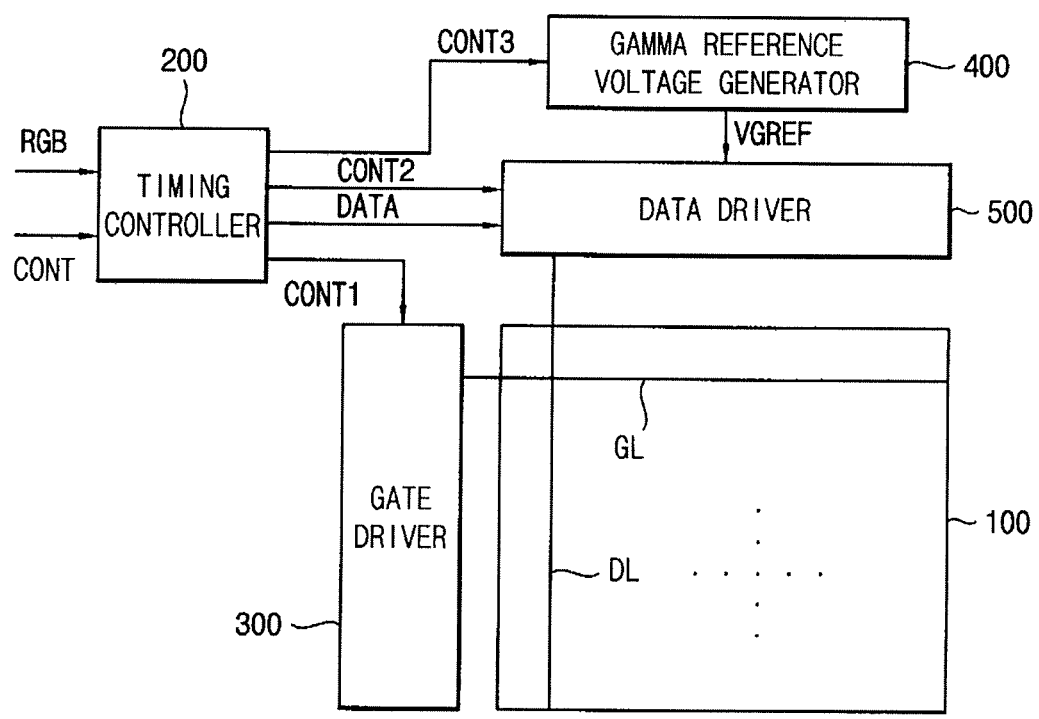
FIG. 1 is a block diagram illustrating a display apparatus according to an exemplary embodiment of the present invention.

FIG. 1 is a block diagram illustrating a display apparatus according to an exemplary embodiment of the present invention.

Referring to FIG. 1, the display apparatus includes a display panel 100 and a panel driver. The panel driver includes a timing controller 200, a gate driver 300, a gamma reference voltage generator 400 and a data driver 500.

The display panel 100 has a display region that is configured to display an image and a peripheral region adjacent the display region. In an exemplary embodiment, images are not displayed within an area of the peripheral region.

The display panel 100 includes a plurality of gate lines GL, a plurality of data lines DL and a plurality of unit pixels connected to the gate lines GL and the data lines DL. In an exemplary embodiment, the gate lines GL extend in a first direction D1 and the data lines DL extend in a second direction D2 crossing the first direction D1.

In an exemplary embodiment, each unit pixel includes a switching element (not shown), a liquid crystal capacitor (not shown) and a storage capacitor (not shown). The liquid crystal capacitor and the storage capacitor are electrically connected to the switching element. In an embodiment, the unit pixels are disposed in a matrix form.

The timing controller 200 receives input image data RGB and an input control signal CONT. In an exemplary embodiment, the timing controller 200 receives the input image data RGB and input control signal CONT from an external apparatus (not shown). In an embodiment, the input image data RGB includes red image data R, green image data G and blue image data B. In an alternate embodiment, the input image data only includes a single color or gray scale. In an embodiment, the input control signal CONT includes a master clock signal and a data enable signal. In an embodiment, the input control signal CONT includes a vertical synchronizing signal and a horizontal synchronizing signal.

The timing controller 200 generates a first control signal CONT1, a second control signal CONT2, a third control signal CONT3 and a data signal DATA based on the input image data RGB and the input control signal CONT.

The timing controller 200 generates the first control signal CONT1 for controlling an operation of the gate driver 300 based on the input control signal CONT, and outputs the first control signal CONT1 to the gate driver 300. In an embodiment, the first control signal CONT1 further includes a vertical start signal and a gate clock signal.

The timing controller 200 generates the second control signal CONT2 for controlling an operation of the data driver 500 based on the input control signal CONT, and outputs the second control signal CONT2 to the data driver 500. In an embodiment, the second control signal CONT2 includes a horizontal start signal and a load signal.

The timing controller 200 generates the data signal DATA based on the input image data RGB. The timing controller 200 outputs the data signal DATA to the data driver 500.

The timing controller 200 generates the third control signal CONT3 for controlling an operation of the gamma reference voltage generator 400 based on the input control signal CONT, and outputs the third control signal CONT3 to the gamma reference voltage generator 400.

The gate driver 300 generates gate signals driving the gate lines GL in response to the first control signal CONTI received from the timing controller 200. The gate driver 300 sequentially outputs the gate signals to the gate lines GL.

The gate driver 300 may be directly mounted on the display panel 100, or may be connected to the display panel 100 as a tape carrier package (TCP) type. Alternatively, the gate driver 300 may be integrated on the display panel 100.

The gamma reference voltage generator 400 generates a gamma reference voltage VGREF in response to the third control signal CONT3 received from the timing controller 200. The gamma reference voltage generator 400 provides the gamma reference voltage VGREF to the data driver 500. The gamma reference voltage VGREF has a value corresponding to a level of the data signal DATA.

In an exemplary embodiment, the gamma reference voltage generator 400 is disposed in the timing controller 200, or in the data driver 500.

The data driver 500 receives the second control signal CONT2 and the data signal DATA from the timing controller 200, and receives the gamma reference voltages VGREF from the gamma reference voltage generator 400. The data driver 500 converts the data signal DATA into data voltages having an analog type using the gamma reference voltages VGREF. In an embodiment, the data driver 500 sequentially outputs the data voltages to the data lines DL.

In an embodiment, the data driver 500 includes a shift register (not shown), a latch (not shown), a signal processing part (not shown) and a buffer part (not shown). The shift register outputs a latch pulse to the latch. The latch temporally stores the data signal DATA. The latch outputs the data signal DATA to the signal processing part. The signal processing part generates a data voltage having an analog type based on the data signal having a digital type and the gamma reference voltage VGREF. The signal processing part outputs the data voltage to the buffer part. The buffer part compensates the data voltage to have a uniform level. The buffer part outputs the compensated data voltage to the data line DL.

The data driver 500 may be directly mounted on the display panel 100, or be connected to the display panel 100 in a TCP type. Alternatively, the data driver 500 may be integrated on the display panel 100.

Figure 2:
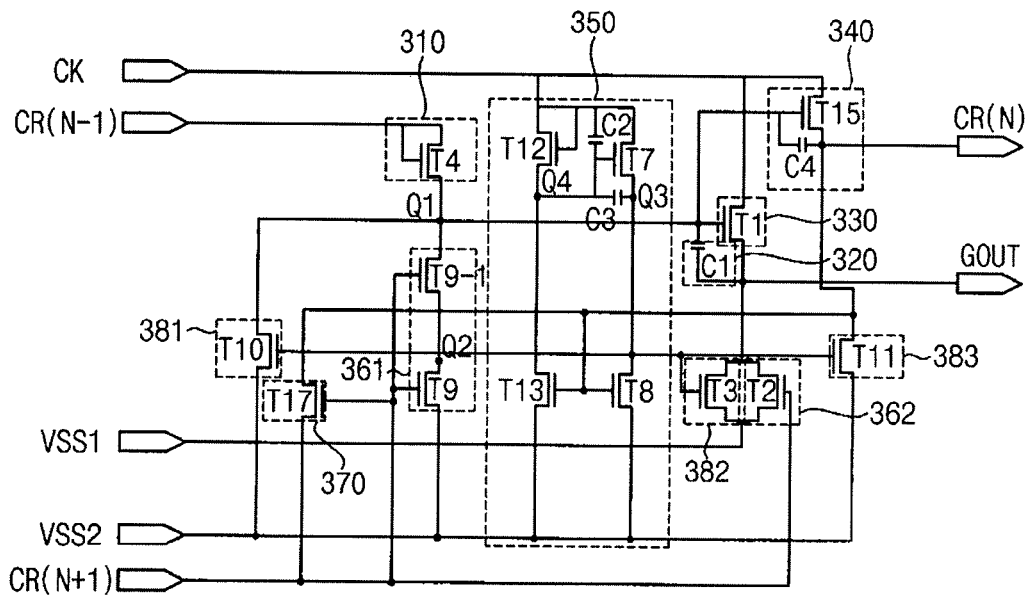
FIG. 2 is an equivalent circuit diagram illustrating an N-th stage of the gate driver of FIG. 1 according to an exemplary embodiment of the present invention.
Figure 3:
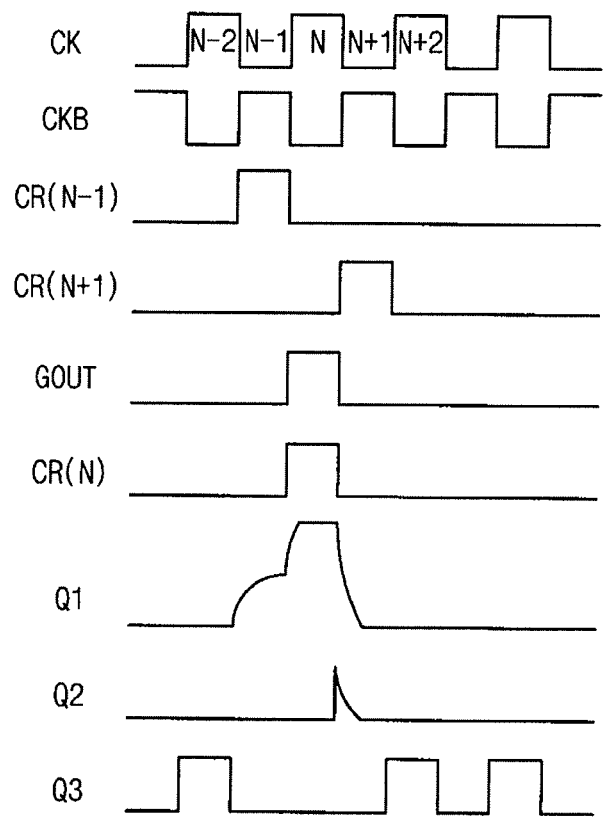
FIG. 3 is a waveform diagram illustrating exemplary input signals, node signals and output signals of the N-th stage of the gate driver of FIG. 2.

FIG. 2 is an equivalent circuit diagram illustrating an N-th stage of the gate driver 300 of FIG. 1. FIG. 3 is a waveform diagram illustrating exemplary input signals, node signals and output signals of the N-th stage of the gate driver 300 of FIG. 2.

Referring to FIGS. 1 to 3, the gate driver 300 receives a first clock signal CK, a second clock signal CKB, a first off voltage VSS1 and a second off voltage VSS2. The gate driver 300 outputs a gate output signal GOUT.

The first clock signal CK is applied to a first clock terminal. The second clock signal CKB is applied to a second clock terminal. The first off voltage VSS1 is applied to a first off terminal. The second off voltage VSS2 is applied to a second off terminal. The gate output signal GOUT is output from a gate output terminal. The gate output signal GOUT may be used to activate a switching device attached to the gate line GL to enable a data voltage to be applied to a pixel of the display panel 100 or to deactivate the switching device to prevent application of the data voltage to the pixel. The switching device may be located within the pixel.

In an exemplary embodiment, the first clock signal CK is a square wave having a high level and a low level that alternate with each other. In an embodiment, the high level of the first clock signal CK corresponds to a gate on voltage. A gate on voltage may be used to activate the switching device attached to the gate line GL. In an embodiment, the low level of the first clock signal CK corresponds to the second gate off voltage VSS2. A gate off voltage may be used to deactivate a gate line GL. In an exemplary embodiment, the duty ratio of the first clock signal CK is 50% or about 50%. Alternatively, the duty ratio of the first clock signal CK may be less than 50%. The first clock signal CK may be applied to odd-numbered stages of the gate driver 300 or to even-numbered stages of the gate driver 300. For example, the gate on voltage may be between about 15V and about 20V.

In an exemplary embodiment, the second clock signal CKB is a square wave having a high level and a low level that alternate with each other. In an embodiment, the high level of the second clock signal CKB corresponds to the gate on voltage. In an embodiment, the low level of the second clock signal CKB corresponds to the second gate off voltage VSS2. In an exemplary embodiment, a duty ratio of the second clock signal CKB is 50% or about 50%. Alternatively, the duty ratio of the second clock signal CKB may be less than 50%. The second clock signal CKB may be applied to odd-numbered stages of the gate driver 300 or to even-numbered stages of the gate driver 300. For example, when the first clock signal CK is applied to the odd-numbered stages of the gate driver 300, the second clock signal CKB is applied to the even-numbered stages of the gate driver 300. For example, when the first clock signal CK is applied to the even-numbered stages of the gate driver 300, the second clock signal CKB is applied to the odd-numbered stages of the gate driver 300. For example, the second clock signal CKB may be an inverting signal of the first clock signal CK.

The first off voltage VSS1 may be a direct-current ("DC") signal. The second off voltage VSS2 may be a DC signal. In an exemplary embodiment, the second off voltage VSS2 has a voltage level lower than a level of the first off voltage VSS1. For example, when the first off voltage VSS1 is about −5V, the second off voltage VSS2 may be about −10V. However, embodiments of the invention are not limited to any particular off voltage values.

The N-th stage outputs an N-th gate output signal GOUT and an N-th carry signal CR(N) in response to an (N−1)-th carry signal CR(N−1) of an (N−1)-th stage, which is a previous stage of the N-th stage. The N-th stage pulls down the N-th gate output signal GOUT to the first off voltage VSS1 in response to an (N+1)-th carry signal CR(N+1) of an (N+1)-th stage, which is a next stage of the N-th stage, where N is a natural number. When a voltage at a first level is pulled down to a second level, it may be lowered from the first level to the second level or to about the second level.

The subsequent stages sequentially output gate output signals GOUT in a manner similar to the first stage.

The (N−1)-th carry signal CR(N−1) is applied to an (N−1)-th carry terminal. The (N+1)-th carry signal CR(N+1) is applied to an (N+1)-th carry terminal. The N-th carry signal CR(N) is output from an N-th carry terminal.

The N-th stage includes a pull-up control part 310, a charging part 320, a pull-up part 330, a carry part 340, an inverting part 350, a first pull-down part 361, a second pull-down part 362, a carry stabilizing part 370, a first holding part 381, a second holding part 382 and a third holding part 383.

The pull-up control part 310 includes a fourth transistor T4. The fourth transistor T4 includes a control electrode and an input electrode commonly connected to the (N−1)-th carry terminal, and an output electrode connected to a first node Q1. The first node Q1 is connected to a control electrode of the pull-up part 330.

The charging part 320 includes a charging capacitor C1. The charging capacitor C1 includes a first electrode connected to the first node Q1 and a second electrode connected to the gate output terminal.

The pull-up part 330 includes a first transistor T1. The first transistor T1 includes a control electrode connected to the first node Q1, an input electrode connected to the first clock terminal and an output electrode connected to the gate output terminal.

The carry part 340 includes a fifteenth transistor T15 and a fourth capacitor C4. The fifteenth transistor T15 includes a control electrode connected to the first node Q1, an input electrode connected to the first clock terminal and an output electrode connected to the N-th carry terminal. The fourth capacitor C4 includes a first electrode connected to the first node Q1 and a second electrode connected to the N-th carry terminal.

The inverting part 350 includes a twelfth transistor T12, a seventh transistor T7, a thirteenth transistor T13, an eighth transistor T8, a second capacitor C2 and a third capacitor C3. The twelfth transistor T12 includes a control electrode and an input electrode commonly connected to the first clock terminal, and an output electrode connected to a fourth node Q4. The seventh transistor T7 includes a control electrode connected to the fourth node Q4, an input electrode connected to the first clock terminal and an output electrode connected to a third node Q3. The thirteenth transistor T13 includes a control electrode connected to the N-th carry terminal, an input electrode connected to the second off terminal and an output electrode connected to the fourth node Q4. The eighth transistor T8 includes a control electrode connected to the N-th carry terminal, an input electrode connected to the second off terminal and an output electrode connected to the third node Q3. The second capacitor C2 includes a first electrode connected to the first clock terminal and a second electrode connected to the fourth node Q4. The third capacitor C3 includes a first electrode connected to the third node Q3 and a second electrode connected to the fourth node Q4.

Herein, the twelfth transistor T12 is a first inverting transistor. The seventh transistor T7 is a second inverting transistor. The thirteenth transistor T13 is a third inverting transistor. The eighth transistor T8 is a fourth inverting transistor.

The first pull-down part 361 includes a plurality of switching elements connected to each other in series. For example, in the embodiment shown in FIG. 2, the first pull-down part 361 includes two transistors connected to each other in series.

For example, the first pull-down part 361 includes a ninth transistor T9 and a "9-1" transistor T9-1. The ninth transistor T9 includes a control electrode connected to the (N+1)-th carry terminal, an input electrode connected to the second off terminal and an output electrode connected to a second node Q2. The 9-1 transistor T9-1 includes a control electrode connected to the (N+1)-th carry terminal, an input electrode connected to the second node Q2 and an output electrode connected to the first node Q1. However, in alternative embodiments, the first pull-down part 361 includes more than two transistors.

When the first pull-down part 361 includes a single transistor, a characteristic of the single transistor of the first pull-down part 361 may be changed due to a voltage between the first node Q1 and the (N+1)-th carry terminal such that reliability of the gate driver 300 deteriorates.

Since the first pull-down part 361 includes two transistors connected to each other in series, a voltage between the first node Q1 and the (N+1)-th carry terminal is divided across the ninth transistor T9 and the 9-1 transistor T9-1. Thus, the reliability of the gate driver 300 may be improved and a lifetime of the gate driver 300 may increase.

In an exemplary embodiment, a ratio between a width to length (W/L) ratio of the ninth transistor T9 and a W/L ratio of the 9-1 transistor T9-1 is about 1:2. When the ratio between the W/L ratio of the ninth transistor T9 and the W/L ratio of the 9-1 transistor T9-1 is about 1:2, a ratio between a resistance of the ninth transistor T9 and a resistance of the 9-1 transistor T9-1 may be about 2:1.

Since the first pull-down part 361 includes transistors connected to each other in series, a time when the second off voltage VSS2 is transmitted to the first node Q1 is delayed. Thus, a level of the gate off signal GOUT falls based on the first clock signal CK such that a size of a second transistor T2 of the second pull-down part 362 may be decreased.

The ninth transistor T9 is a first pull-down transistor and the 9-1 transistor is a second pull-down transistor.

The second pull-down part 362 includes the second transistor T2. The second transistor T2 includes a control electrode connected to the (N+1)-th carry terminal, an input electrode connected to the first off terminal and an output electrode connected to the gate output terminal.

The carry stabilizing part 370 includes a seventeenth transistor T17. The seventeenth transistor T17 includes a control electrode and an input electrode commonly connected to the (N+1)-th carry terminal, and an output electrode connected to the N-th carry terminal.

The carry stabilizing part 370 may reduce noise due to a leakage current transmitted through a fourth transistor T4 of the (N+1)-th stage.

The first holding part 381 includes a tenth transistor T10. The tenth transistor T10 includes a control electrode connected to the third node Q3, an input electrode connected to the second off terminal and an output electrode connected to the first node Q1.

The second holding part 382 includes a third transistor T3. The third transistor T3 includes a control electrode connected to the third node Q3, an input electrode connected to the first off terminal and an output electrode connected to the gate output terminal.

The third holding part 383 includes an eleventh transistor T11. The eleventh transistor T11 includes a control electrode connected to the third node Q3, an input electrode connected to the second off terminal and an output electrode connected to the N-th carry terminal.

While the (N−1)-th carry signal is used as a previous carry signal in an exemplary embodiment, the previous carry signal is not limited to the (N−1)-th carry signal. For example, the previous carry signal may be a carry signal output by a stage before the first previous stage. In addition, although the (N+1)-th carry signal is used as a next carry signal in an exemplary embodiment, the next carry signal is not limited to the (N+1)-th carry signal. For example, the next carry signal may be a carry signal output by a stage that is after the first next stage.

In an exemplary embodiment the first, second, third, fourth, seventh, eighth, ninth, 9-1, tenth, eleventh, twelfth, thirteenth, fourteenth, fifteenth and seventeenth transistors are oxide semiconductor transistors. Alternatively, the first, second, third, fourth, seventh, eighth, ninth, 9-1, tenth, eleventh, twelfth, thirteenth, fourteenth, fifteenth and seventeenth transistors may be amorphous silicon transistors.

Referring to FIG. 3, the first clock signal CK has a high level corresponding to an (N−2)-th stage, an N-th stage, (N+2)-th stage and an (N+4)-th stage. The second clock signal CKB has a high level corresponding to an (N−1)-th stage, an (N+1)-th stage and an (N+3)-th stage.

The (N−1)-th carry signal CR(N−1) has a high level corresponding to the (N−1)-th stage. The (N+1)-th carry signal CR(N+1) has a high level corresponding to the (N+1)-th stage.

The gate output signal GOUT of the N-th stage is synchronized with the first clock signal CK, and has a high level corresponding to the N-th stage. The N-th carry signal CR(N) is synchronized with the first clock signal CK, and has a high level corresponding to the N-th stage.

A voltage of the first node Q1 of the N-th stage is increased to a first level corresponding to the (N−1)-th stage by the pull-up control part 310. The voltage of the first node Q1 of the N-th stage is increased to a second level, which is higher than the first level, corresponding to the N-th stage by the pull-up part 330 and the charging part 320. The voltage of the first node Q1 of the N-th stage is decreased corresponding to the (N+1)-th stage by the first pull-down part 361.

A voltage of the second node Q2 of the N-th stage is temporally increased and decreased corresponding to the (N+1)-th stage by the first pull-down part 361.

A voltage of the third node Q3 of the N-th stage is synchronized with the first clock signal CK. The voltage of the third node Q3 of the N-th stage has a high level corresponding to the (N−2)-th stage, (N+2)-th stage and the (N+4)-th stage by the inverting part 350. The voltage of the third node Q3 of the N-th stage has a high level except for the N-th stage at which the gate output signal GOUT has a high level. In an exemplary embodiment, the voltage of the third node Q3 is an inverting output signal.

According to an exemplary embodiment, the first pull-down part 361 includes a plurality of the transistors connected to each other in series. Accordingly, reliability of the gate driver 300 may be improved and a lifetime of the gate driver 300 may increase. In addition, a size of the second transistor T2 of the second pull-down part 362 may be decreased.

Figure 4:
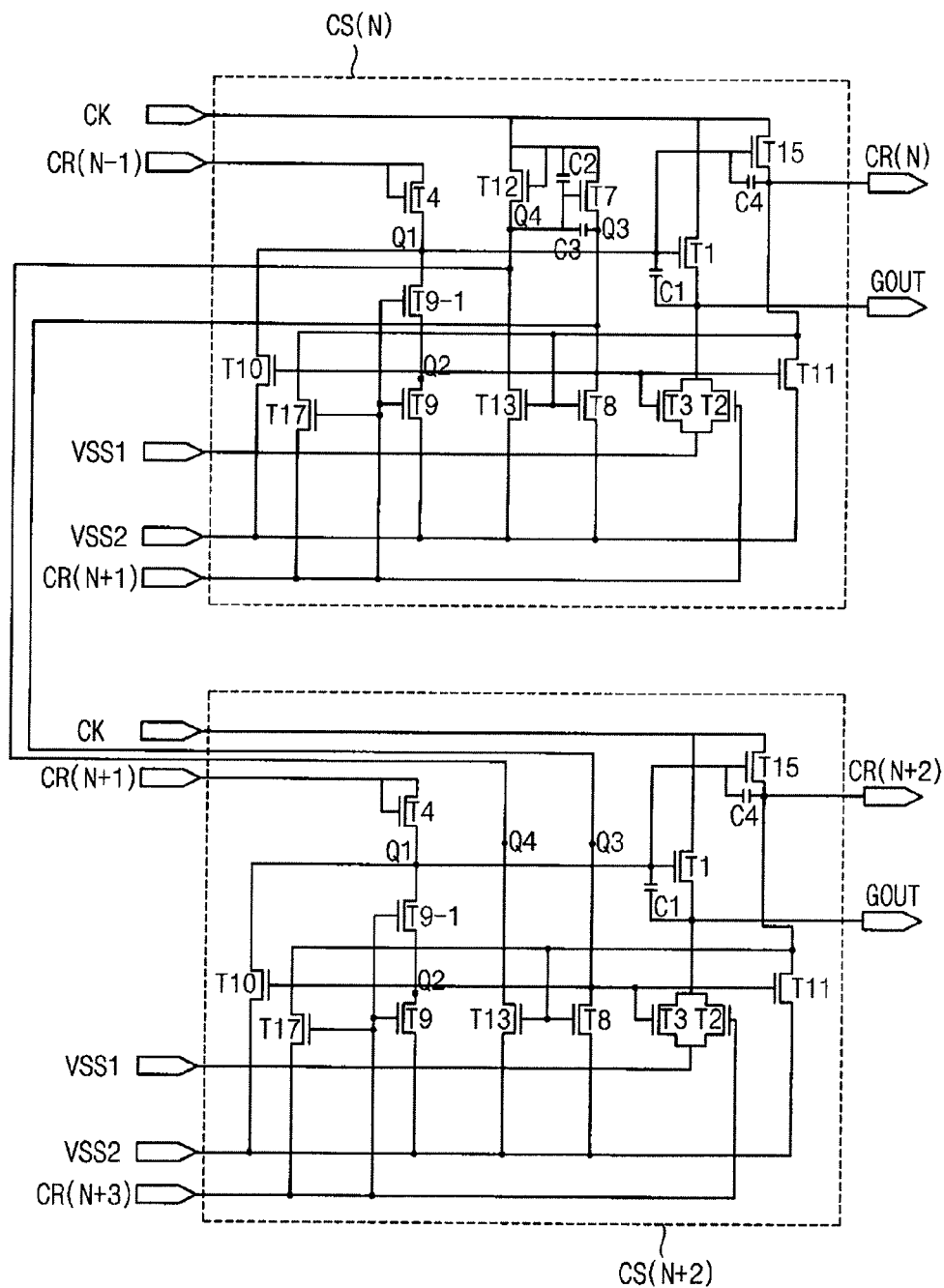
FIG. 4 is an equivalent circuit diagram illustrating an N-th stage and an (N+2)-th stage of a gate driver according to an exemplary embodiment of the present invention.
Figure 5:
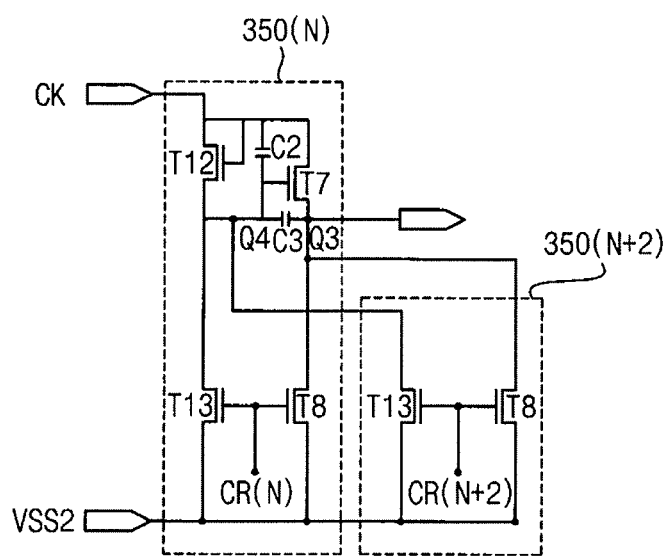
FIG. 5 is an equivalent circuit diagram illustrating an inverting part of the N-th stage and an inverting part of the (N+2)-th stage of the gate driver of FIG. 4 according to an exemplary embodiment of the present invention.
Figure 6:
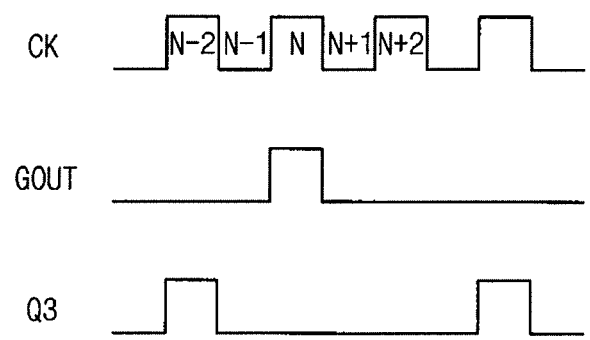
FIG. 6 is a waveform diagram illustrating an exemplary clock signal, third node signal and gate output signal of the N-th stage of the gate driver of FIG. 4.

FIG. 4 is an equivalent circuit diagram illustrating an N-th stage CS(N) and an (N+2)-th stage CS(N+2) of a gate driver according to an exemplary embodiment of the present invention. FIG. 5 is an equivalent circuit diagram illustrating an inverting part 350(N) of the N-th stage and an inverting part 350(N+2) of the (N+2)-th stage of the gate driver of FIG. 4. FIG. 6 is a waveform diagram illustrating an exemplary clock signal, an exemplary third node signal and an exemplary gate output signal of the N-th stage of the gate driver of FIG. 4.

A display apparatus according to the exemplary embodiment described with respect to FIGS. 4 to 6 is substantially the same as a display apparatus described with respect to FIGS. 1 to 3 except that the inverting part of the N-th stage of the gate driver is connected to the inverting part of at least one of the next stages. Thus, the same reference numerals will be used to refer to the same or like parts as those described in the exemplary embodiment of FIGS. 1 to 3.

Referring to FIGS. 4 to 6, the N-th stage CS(N) is driven in response to a (N−1)-th carry signal CR(N−1) of an (N−1)-th stage, which is a previous stage of the N-th stage CS(N). The N-th stage CS(N) outputs an N-th gate output signal GOUT and an N-th carry signal CR(N) in response to the (N−1)-th carry signal CR(N−1) of the (N−1)-th stage. The N-th stage CS(N) pulls down the gate output signal GOUT to a first gate off voltage VSS1 in response to a (N+1)-th carry signal CR(N+1) of an (N+1)-th stage, which is a next stage of the N-th stage CS(N).

The (N+2)-th stage CS(N+2) is driven in response to the (N+1)-th carry signal CR(N+1) of the (N+1)-th stage, which is a previous stage of the (N+2)-th stage CS(N+2). The (N+2)-th stage CS(N+2) outputs an N-th gate output signal GOUT and an (N+2)-th carry signal CR(N+2) in response to the (N+1)-th carry signal CR(N+1) of the (N+1)-th stage. The (N+2)-th stage CS(N+2) pulls down the gate output signal GOUT to the first gate off voltage VSS1 in response to a (N+3)-th carry signal CR(N+3) of an (N+3)-th stage, which is a next stage of the (N+2)-th stage CS(N+2).

The N-th stage CS(N) includes a pull-up control part 310, a charging part 320, a pull-up part 330, a carry part 340, an inverting part 350(N), a first pull-down part 361, a second pull-down part 362, a carry stabilizing part 370, a first holding part 381, a second holding part 382 and a third holding part 383.

The (N+2)-th stage CS(N+2) includes a pull-up control part 310, a charging part 320, a pull-up part 330, a carry part 340, an inverting part 350(N+2), a first pull-down part 361, a second pull-down part 362, a carry stabilizing part 370, a first holding part 381, a second holding part 382 and a third holding part 383.

The inverting part 350(N) of the N-th stage CS(N) may be connected to an inverting part of at least one of the next stages. For example, the inverting part 350(N) of the N-th stage CS(N) may be connected to the inverting part 350(N+2) of the (N+2)-th stage CS(N+2). Although not shown in figures, the inverting part 350(N) of the N-th stage CS(N) may be connected to inverting parts of two or more next stages.

The inverting part 350(N) of the N-th stage CS(N) includes a twelfth transistor T12, a seventh transistor T7, a thirteenth transistor T13, an eighth transistor T8, a second capacitor C2 and a third capacitor C3.

The twelfth transistor T12 of the inverting part 350(N) of the N-th stage CS(N) includes a control electrode and an input electrode commonly connected to a first clock terminal, and an output electrode connected to a fourth node Q4. The seventh transistor T7 includes a control electrode connected to the fourth node Q4, an input electrode connected to the first clock terminal and an output electrode connected to a third node Q3. The thirteenth transistor T13 of the inverting part 350(N) of the N-th stage CS(N) includes a control electrode connected to an N-th carry terminal, an input electrode connected to a second off terminal and an output electrode connected to the fourth node Q4. The eighth transistor T8 of the inverting part 350(N) of the N-th stage CS(N) includes a control electrode connected to the N-th carry terminal, an input electrode connected to the second off terminal and an output electrode connected to the third node Q3.

The thirteenth transistor T13 of the inverting part 350(N+2) of the (N+2)-th stage CS(N+2) includes a control electrode connected to an (N+2)-th carry terminal, an input electrode connected to the second off terminal and an output electrode connected to the fourth node Q4. The eighth transistor T8 of the inverting part 350(N+2) of the (N+2)-th stage CS(N+2) includes a control electrode connected to the (N+2)-th carry terminal, an input electrode connected to the second off terminal and an output electrode connected to the third node Q3.

The inverting part 350(N) of the N-th stage CS(N) and the inverting part 350(N+2) of the (N+2)-th stage CS(N+2) share the twelfth transistor T12 and the seventh transistor T7. Thus, the twelfth transistor T12 and the seventh transistor T7 may be omitted in the inverting part 350(N+2) of the (N+2)-th stage CS(N+2). Therefore, power consumption and a manufacturing cost of the gate driver may decrease.

Referring to FIG. 6, the first clock signal CK has a high level corresponding to an (N−2)-th stage, the N-th stage CS(N) and the (N+2)-th stage CS(N+2).

The gate output signal GOUT of the N-th stage CS(N) is synchronized with the first clock signal CK. The gate output signal GOUT of the N-th stage CS(N) has a high level corresponding to the N-th stage CS(N).

A voltage of the third node Q3 of the N-th stage CS(N) is synchronized with the first clock signal CK. The voltage of the third node Q3 of the N-th stage has a high level corresponding to the (N−2)-th stage and an (N+4)-th stage by the inverting parts 350(N) and 350(N+2). The voltage of the third node Q3 of the N-th stage CS(N) has a high level except for the N-th stage CS(N) and the (N+2)-th stage CS(N+2) at which the gate output signal GOUT has a high level.

According to an exemplary embodiment, the first pull-down part 361 includes a plurality of the transistors connected to each other in series. Accordingly, a reliability of the gate driver 300 may be improved and a lifetime of the gate driver 300 may increase. In addition, a size of the second transistor T2 of the second pull-down part 362 may be decreased.

The inverting part 350(N) of the N-th stage CS(N) is connected to the inverting part of at least one of the next stages so that power consumption and a manufacturing cost of the gate driver 30 may decrease.

Figure 7:
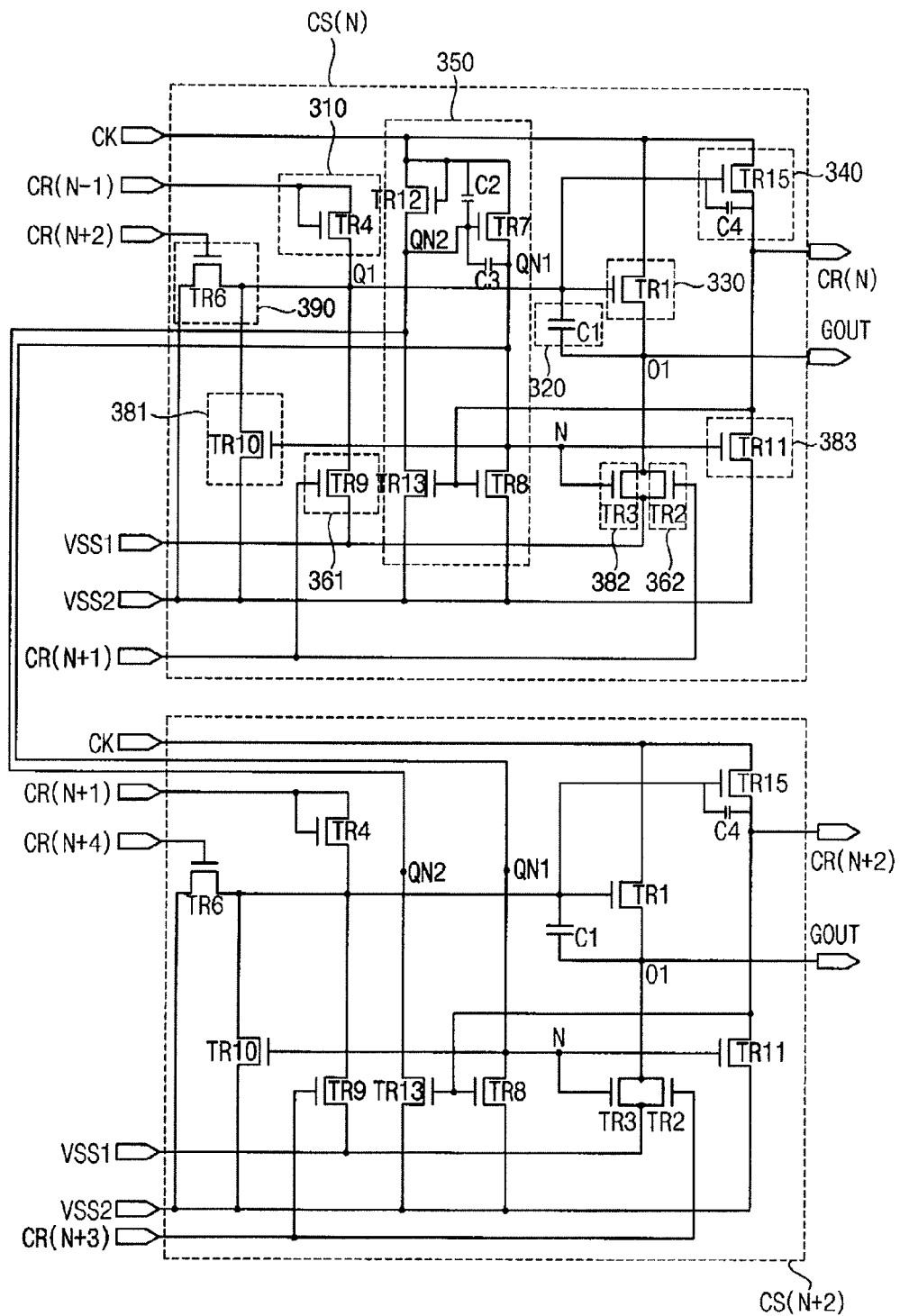
FIG. 7 is an equivalent circuit diagram illustrating an N-th stage and an (N+2)-th stage of a gate driver according to an exemplary embodiment of the present invention.

FIG. 7 is an equivalent circuit diagram illustrating N-th stage and (N+2)-th stage of a gate driver according to an exemplary embodiment of the present invention.

A display apparatus that includes the gate driver of FIG. 7 is substantially the same as a display apparatus that includes the gate driver described with respect to FIGS. 4 to 6 except for certain elements. Thus, the same reference numerals will be used to refer to the same or like parts as those described in the exemplary embodiment of FIGS. 4 to 6.

Referring to FIG. 7, an N-th stage CS(N) includes a pull-up control part 310, a charging part 320, a pull-up part 330, a carry part 340, an inverting part 350, a first pull-down part 361, a second pull-down part 362, a first holding part 381, a second holding part 382, a third holding part 383 and a reset part 390.

The pull-up control part 310 includes a fourth transistor TR4. The fourth transistor TR4 includes a control electrode and an input electrode commonly connected to an (N−1)-th carry terminal, and an output electrode connected to a first node Q1. The first node Q1 is connected to a control electrode of the pull-up part 330.

The charging part 320 includes a charging capacitor C1. The charging capacitor C1 includes a first electrode connected to the first node Q1 and a second electrode connected to a gate output terminal.

The pull-up part 330 includes a first transistor TR1. The first transistor TR1 includes a control electrode connected to the first node Q1, an input electrode connected to a first clock terminal and an output electrode connected to the gate output terminal.

The carry part 340 includes a fifteenth transistor TR15 and a fourth capacitor C4. The fifteenth transistor TR15 includes a control electrode connected to the first node Q1, an input electrode connected to the first clock terminal and an output electrode connected to an N-th carry terminal. The fourth capacitor C4 includes a first electrode connected to the first node Q1 and a second electrode connected to the N-th carry terminal.

The inverting part 350 includes a twelfth transistor TR12, a seventh transistor TR7, a thirteenth transistor TR13, an eighth transistor TR8, a second capacitor C2 and a third capacitor C3. The twelfth transistor TR12 includes a control electrode and an input electrode commonly connected to the first clock terminal, and an output electrode connected to a second inverting node QN2. The seventh transistor TR7 includes a control electrode connected to the second inverting node QN2, an input electrode connected to the first clock terminal and an output electrode connected to a first inverting node QN1. The thirteenth transistor TR13 includes a control electrode connected to the N-th carry terminal, an input electrode connected to the second off terminal and an output electrode connected to the second inverting node QN2. The eighth transistor TR8 includes a control electrode connected to the N-th carry terminal, an input electrode connected to the second off terminal and an output electrode connected to the first inverting node QN1. The second capacitor C2 includes a first electrode connected to the first clock terminal and a second electrode connected to the second inverting node QN2. The third capacitor C3 includes a first electrode connected to the first inverting node QN1 and a second electrode connected to the second inverting node QN2.

Herein, the twelfth transistor TR12 is a first inverting transistor. The seventh transistor TR7 is a second inverting transistor. The thirteenth transistor TR13 is a third inverting transistor. The eighth transistor TR8 is a fourth inverting transistor.

The first pull-down part 361 includes a ninth transistor TR9. The ninth transistor TR9 includes a control electrode connected to the (N+1)-th carry terminal, an input electrode connected to a first off terminal and an output electrode connected to the first node Q1.

The second pull-down part 362 includes a second transistor TR2. The second transistor TR2 includes a control electrode connected to the (N+1)-th carry terminal, an input electrode connected to the first off terminal and an output electrode connected to the gate output terminal.

The first holding part 381 includes a tenth transistor TR10. The tenth transistor TR10 includes a control electrode connected to the first inverting node QN1, an input electrode connected to the second off terminal and an output electrode connected to the first node Q1.

The second holding part 382 includes a third transistor TR3. The third transistor TR3 includes a control electrode connected to the first inverting node QN1, an input electrode connected to the first off terminal and an output electrode connected to the gate output terminal.

The third holding part 383 includes an eleventh transistor TR11. The eleventh transistor TR11 includes a control electrode connected to the first inverting node QN1, an input electrode connected to the second off terminal and an output electrode connected to the N-th carry terminal.

The reset part 390 includes a sixth transistor TR6. The sixth transistor TR6 includes a control electrode connected to an (N+2)-th carry terminal, an input electrode connected to the second off terminal and an output electrode connected to the first node Q1.

An (N+2)-th stage CS(N+2) includes a pull-up control part 310, a charging part 320, a pull-up part 330, a carry part 340, an inverting part 350, a first pull-down part 361, a second pull-down part 362, a first holding part 381, a second holding part 382, a third holding part 383 and a reset part 390.

The inverting part 350(N) of the N-th stage CS(N) is connected to an inverting part of at least one of the next stages. For example, the inverting part 350(N) of the N-th stage may be connected to the inverting part of the (N+2)-th stage CS(N+2). Although not shown in figures, the inverting part 350(N) of the N-th stage CS(N) may be connected to inverting parts of two or more next stages.

The inverting part 350(N) of the N-th stage CS(N) includes the twelfth transistor TR12, the seventh transistor TR7, the thirteenth transistor TR13, the eighth transistor TR8, the second capacitor C2 and the third capacitor C3.

The thirteenth transistor TR13 of the inverting part 350(N+2) of the (N+2)-th stage CS(N+2) includes a control electrode connected to an (N+2)-th carry terminal, an input electrode connected to the second off terminal and an output electrode connected to the second inverting node QN2. The eighth transistor TR8 of the inverting part 350(N+2) of the (N+2)-th stage CS(N+2) includes a control electrode connected to the (N+2)-th carry terminal, an input electrode connected to the second off terminal and an output electrode connected to the first inverting node QN 1.

The inverting part 350(N) of the N-th stage CS(N) and the inverting part 350(N+2) of the (N+2)-th stage CS(N+2) share the twelfth transistor TR12 and the seventh transistor TR7. Thus, the twelfth transistor TR12 and the seventh transistor TR7 may be omitted in the inverting part 350(N+2) of the (N+2)-th stage CS(N+2). Therefore, power consumption and a manufacturing cost of the gate driver may decrease.

According to an exemplary embodiment, the inverting part 350(N) of the N-th stage CS(N) is connected to the inverting part of at least one of the next stages. Accordingly, power consumption and a manufacturing cost of the gate driver 30 may decrease.

According to at least one embodiment of the present invention, a reliability of a gate driving circuit may be improved, a lifetime of a gate driving circuit may increase, and power consumption and a manufacturing cost of a gate driving circuit may decrease.

Although exemplary embodiments of the present invention have been described above, many modifications can be made in these exemplary embodiments without materially departing from the present invention. Accordingly, all such modifications are intended to be included within the scope of the present invention.

What is claimed is:

1. A gate driving circuit, wherein an N-th stage of the gate driving circuit comprises:
    a pull-up control part configured to apply a previous carry signal to a first node from a stage previous to the N-th stage in response to the previous carry signal;
    a pull-up part configured to output an N-th gate output signal based on a clock signal in response to a signal applied to the first node;
    a carry part configured to output an N-th carry signal based on the clock signal in response to the signal applied to the first node;
    a first pull-down part comprising a plurality of transistors connected to each other in series and configured to pull down a signal at the first node to a second off voltage in response to a next carry signal from a stage after the N-th stage; and
    a second pull-down part configured to pull down the N-th gate output signal to a first off voltage in response to the next carry signal, wherein N is a natural number.

2. The gate driving circuit of claim 1, wherein the first pull-down part comprises a first pull-down transistor and a second pull-down transistor,
    the first pull-down transistor comprises a control electrode configured to receive the next carry signal, an input electrode configured to receive the second off voltage and an output electrode connected to a second node, and
    the second pull-down transistor comprises a control electrode configured to receive the next carry signal, an input electrode connected to the second node and an output electrode connected to the first node.

3. The gate driving circuit of claim 2, wherein a ratio between a width to length ("W/L") ratio of the first pull-down transistor and a W/L ratio of the second pull-down transistor is about 1:2.

4. The gate driving circuit of claim 1, wherein the N-th stage further comprises a carry stabilizing transistor comprising a control electrode and an input electrode commonly configured to receive the next carry signal and an output electrode connected to a terminal outputting the N-th carry signal.

5. The gate driving circuit of claim 1, wherein the N-th stage further comprises an inverting part configured to receive the clock signal and the second off voltage, and output an inverting signal,
    wherein the inverting part of the N-th stage is connected to an inverting part of at least one stage that is after the N-th stage.

6. The gate driving circuit of claim 5, wherein the inverting part of the N-th stage is connected to an inverting part of an (N+2)-th stage.

7. The gate driving circuit of claim 6, wherein the inverting part of the N-th stage comprises a first inverting transistor, a second inverting transistor, a third inverting transistor and a fourth inverting transistor, and the inverting part of the (N+2)-th stage comprises the third inverting transistor and the fourth inverting transistor.

8. The gate driving circuit of claim 7, wherein the first inverting transistor of the N-th stage comprises a control electrode and an input electrode commonly configured to receive the clock signal and an output electrode connected to a fourth node,
    the second inverting transistor of the N-th stage comprises a control electrode connected to the fourth node, an input electrode configured to receive the clock signal and an output electrode connected to a third node,
    the third inverting transistor of the N-th stage comprises a control electrode connected to a terminal outputting the N-th carry signal, an input electrode configured to receive the second off voltage and an output electrode connected to the fourth node, and
    the fourth inverting transistor of the N-th stage comprises a control electrode connected to the terminal outputting the N-th carry signal, an input electrode configured to receive the second off voltage, and an output electrode connected to the third node.

9. The gate driving circuit of claim 8, wherein the third inverting transistor of the (N+2)-th stage comprises a control electrode connected to a terminal configured to output an (N+2)-th carry signal, an input electrode configured to receive the second off voltage and an output electrode connected to the fourth node, and
    the fourth inverting transistor of the (N+2)-th stage comprises a control electrode connected to the terminal configured to output the (N+2)-th carry signal, an input electrode configured to receive the second off voltage and an output electrode connected to the third node.

10. A gate driving circuit, wherein an N-th stage of the gate driving circuit comprises:
    a pull-up control part configured to apply a previous carry signal to a first node from a stage previous to the N-th stage in response to the previous carry signal;
    a pull-up part configured to output an N-th gate output signal based on a clock signal in response to a signal applied to the first node;
    a carry part configured to output an N-th carry signal based on the clock signal in response to the signal applied to the first node;
    a first pull-down part configured to pull down a signal at the first node to a second off voltage in response to a next carry signal from a stage after the N-th stage;
    a second pull-down part configured to pull down the N-th gate output signal to a first off voltage in response to the next carry signal; and
    an inverting part configured to receive the clock signal and the second off voltage, and output an inverting signal,
    wherein the inverting part of the N-th stage is connected to an inverting part of at least one stage that is after the N-th stage, and
    N is a natural number.

11. The gate driving circuit of claim 10, wherein the inverting part of the N-th stage is connected to an inverting part of an (N+2)-th stage.

12. The gate driving circuit of claim 11, wherein the inverting part of the N-th stage comprises a first inverting transistor, a second inverting transistor, a third inverting transistor and a fourth inverting transistor, and the inverting part of the (N+2)-th stage comprises the third inverting transistor and the fourth inverting transistor.

13. The gate driving circuit of claim 12, wherein the first inverting transistor of the N-th stage comprises a control electrode and an input electrode configured to commonly receive the clock signal and an output electrode connected to a second inverting node, the second inverting transistor of the N-th stage comprises a control electrode connected to the second inverting node, an input electrode configured to receive the clock signal and an output electrode connected to a first inverting node, the third inverting transistor of the N-th stage comprises a control electrode connected to a terminal outputting the N-th carry signal, an input electrode configured to receive the second off voltage and an output electrode connected to the second inverting node, and the fourth inverting transistor of the N-th stage comprises a control electrode connected to the terminal configured to output the N-th carry signal, an input electrode configured to receive the second off voltage and an output electrode connected to the first inverting node.

14. The gate driving circuit of claim 13, wherein the third inverting transistor of the (N+2)-th stage comprises a control electrode connected to a terminal configured to output an (N+2)-th carry signal, an input electrode configured to receive the second off voltage and an output electrode connected to the second inverting node, and the fourth inverting transistor of the (N+2)-th stage comprises a control electrode connected to the terminal configured to output the (N+2)-th carry signal, an input electrode configured to receive the second off voltage and an output electrode connected to the first inverting node.

15. A display apparatus comprising:
a display panel comprising a display region on which an image is configured to be displayed and a peripheral region adjacent the display region;
a data driving circuit configured to apply a data voltage to the display panel; and
a gate driving circuit configured to apply a gate output signal to the display panel, wherein an N-th stage of the gate driving circuit comprises:
a pull-up control part configured to apply a previous carry signal to a first node from a stage previous to the N-th stage in response to the previous carry signal;
a pull-up part configured to output an N-th gate output signal based on a clock signal in response to a signal applied to the first node;
a carry part configured to output an N-th carry signal based on the clock signal in response to the signal applied to the first node;
a first pull-down part including a plurality of transistors connected to each other in series and configured to pull down a signal at the first node to a second off voltage in response to a next carry signal from a stage after the N-th stage; and
a second pull-down part configured to pull down the N-th gate output signal to a first off voltage in response to the next carry signal,
wherein N is a natural number.

16. The display apparatus of claim 15, wherein the first pull-down part comprises a first pull-down transistor and a second pull-down transistor,
the first pull-down transistor comprises a control electrode configured to receive the next carry signal, an input electrode configured to receive the second off voltage and an output electrode connected to a second node, and
the second pull-down transistor comprises a control electrode configured to receive the next carry signal, an input electrode connected to the second node and an output electrode connected to the first node.

17. The display apparatus of claim 15, wherein the N-th stage further comprises an inverting part configured to receive the clock signal and the second off voltage, and output an inverting signal, and
wherein the inverting part of the N-th stage is connected to an inverting part of at least one stage that is after the N-th stage.

18. The display apparatus of claim 17, wherein the inverting part of the N-th stage is connected to an inverting part of an (N+2)-th stage.

19. The display apparatus of claim 18, wherein the inverting part of the N-th stage comprises a first inverting transistor, a second inverting transistor, a third inverting transistor and a fourth inverting transistor, and
the inverting part of the (N+2)-th stage comprises the third inverting transistor and the fourth inverting transistor.

20. The display apparatus of claim 15, wherein the gate driving circuit is integrated on the peripheral region of the display panel.

21. A display apparatus comprising:
a display panel comprising a display region on which an image is configured to be displayed and a peripheral region adjacent the display region;
a data driving circuit configured to apply a data voltage to the display panel; and
a gate driving circuit configured to apply a gate output signal to the display panel, wherein an N-th stage of the gate driving circuit comprises:
a pull-up control part configured to apply a previous carry signal to a first node from a stage previous the N-th stage in response to the previous carry signal;
a pull-up part configured to output an N-th gate output signal based on a clock signal in response to a signal applied to the first node;
a carry part configured to output an N-th carry signal based on the clock signal in response to the signal applied to the first node;
a first pull-down part configured to pull down a signal at the first node to a second off voltage in response to a next carry signal from a stage after the N-th stage;
a second pull-down part configured to pull down the N-th gate output signal to a first off voltage in response to the next carry signal; and
an inverting part configured to receive the clock signal and the second off voltage, and output an inverting signal,
wherein the inverting part of the N-th stage is connected to an inverting part of at least one stage that is after the N-th stage, and
N is a natural number.

22. The display apparatus of claim 21, wherein the inverting part of the N-th stage is connected to an inverting of an (N+2)-th stage.

23. The display apparatus of claim 22, wherein the inverting part of the N-th stage comprises a first inverting transistor, a second inverting transistor, a third inverting transistor and a fourth inverting transistor, and
the inverting part of the (N+2)-th stage comprises the third inverting transistor and the fourth inverting transistor.

24. The display apparatus of claim 21, wherein the gate driving circuit is integrated on the peripheral region of the display panel.

25. A gate driving circuit comprising:

first through sixth stages, wherein each of the second and fourth stages comprises a pull-up control part, a charging part, a pull-up part, a carry part, an inverting part, a first pull-down part, a second pull-down part, a first holding part, a second holding part, a third holding part, and a reset part, where a clock signal is applied to each inverting part and each carry part, wherein a first carry signal output from the first stage is applied to the pull-up control part of the second stage, wherein the second stage outputs a second carry signal, wherein a third carry signal output from the third stage is applied to the first pull-down part of the second stage, the second pull-down part of the second stage, and the pull-up control part of the fourth stage, wherein a fourth carry signal output from the fourth stage is applied to the reset part of the second stage, wherein a fifth carry signal output from the fifth stage is applied to the first pull-down part and the second pull-down part of the fourth stage, and wherein a sixth carry signal output from the sixth stage is applied to the reset part of the fourth stage.

26. The gate driving circuit of claim 25, wherein a first off voltage is applied to each first pull-down part, each second holding part, and each second pull-down part, wherein a second off voltage is applied to each reset part, each first holding part, each inverting part, and each third holding part, wherein the second off voltage is lower than the first off voltage.

27. The gate driving circuit of claim 25, wherein the inverting part of the second stage comprises first through fourth transistors, wherein the inverting part of the fourth stage includes fifth and sixth transistors, wherein a non-control terminal of the fifth transistor is connected to a node between the first and third transistors, and wherein a non-control terminal of the sixth transistor is connected to a node between the second and fourth transistors.

* * * * *